US011016055B2

(12) United States Patent
Campanella-Pineda et al.

(10) Patent No.: US 11,016,055 B2
(45) Date of Patent: May 25, 2021

(54) SENSORS WITH A FRONT-END-OF-LINE SOLUTION-RECEIVING CAVITY

(71) Applicant: GLOBALFOUNDRIES Singapore Pte. Ltd., Singapore (SG)

(72) Inventors: Humberto Campanella-Pineda, Singapore (SG); Qizhi Liu, Lexington, MA (US); Vibhor Jain, Essex Junction, VT (US); You Qian, Singapore (SG); Joan Josep Giner de Haro, Singapore (SG)

(73) Assignee: GLOBALFOUNDRIES SINGAPORE PTE. LTD., Singapore (SG)

( * ) Notice: Subject to any disclaimer, the term of this patent is extended or adjusted under 35 U.S.C. 154(b) by 0 days.

(21) Appl. No.: 16/506,236

(22) Filed: Jul. 9, 2019

(65) Prior Publication Data

US 2021/0010971 A1    Jan. 14, 2021

(51) Int. Cl.
*G01N 27/414* (2006.01)
*H01L 27/12* (2006.01)
*H01L 29/66* (2006.01)
*H01L 29/78* (2006.01)
*H01L 29/778* (2006.01)

(52) U.S. Cl.
CPC ....... *G01N 27/414* (2013.01); *H01L 27/1203* (2013.01); *H01L 29/66484* (2013.01); *H01L 29/7786* (2013.01); *H01L 29/7831* (2013.01)

(58) Field of Classification Search
CPC .......... H01L 29/7831; H01L 29/66484; G01N 27/414; G01N 27/3276
See application file for complete search history.

(56) References Cited

U.S. PATENT DOCUMENTS

| | | | |
|---|---|---|---|
| 7,015,147 B2 | 3/2006 | Lee et al. | |
| 7,868,354 B2 | 1/2011 | Garcia et al. | |
| 8,835,984 B2 | 9/2014 | Ren et al. | |
| 9,349,793 B2 | 5/2016 | Jaffe et al. | |
| 9,455,232 B2 * | 9/2016 | Werner | H01L 21/02118 |
| 9,459,234 B2 | 10/2016 | Kalnitsky et al. | |
| 9,625,409 B1 | 4/2017 | Cai et al. | |
| 9,719,959 B2 | 8/2017 | Kang et al. | |
| 9,755,015 B1 | 9/2017 | Phelps et al. | |
| 10,529,854 B1 * | 1/2020 | Verma | H01L 21/76264 |

(Continued)

OTHER PUBLICATIONS

A.R Clawson, "Guide to references on III-V semiconductor chemical etching", Materials Science and Engineering: R: Reports, vol. 31, Issues 1-6, 2001, pp. 1-438.

(Continued)

*Primary Examiner* — Ahmed N Sefer
(74) *Attorney, Agent, or Firm* — Thompson Hine LLP; Francois Pagette

(57) ABSTRACT

Structures for transistor-based sensors and related fabrication methods. A layer stack is formed that includes a semiconductor layer and a cavity. A transistor is formed that has a gate electrode over the layer stack, and an interconnect structure is formed over the layer stack and the transistor. First and second openings are formed that extend through the metallization levels of the interconnect structure and the semiconductor layer to the cavity. The first opening defines a fluid inlet coupled to the cavity, and the second opening defines a fluid outlet coupled to the cavity.

20 Claims, 12 Drawing Sheets

(56) References Cited

U.S. PATENT DOCUMENTS

| | | | | |
|---|---|---|---|---|
| 2005/0037593 | A1* | 2/2005 | Delpech | H01L 21/76264 438/404 |
| 2005/0176222 | A1* | 8/2005 | Ogura | H01L 21/3247 438/514 |
| 2008/0032474 | A1* | 2/2008 | Hamamoto | H01L 27/108 438/253 |
| 2009/0085071 | A1* | 4/2009 | Brongersma | G01N 27/4146 257/253 |
| 2011/0045660 | A1* | 2/2011 | Romano | H01L 29/0673 438/478 |
| 2011/0108942 | A1* | 5/2011 | Fenouillet-Beranger | H01L 21/764 257/503 |
| 2012/0223406 | A1* | 9/2012 | Warabino | H01L 29/78 257/506 |
| 2013/0037919 | A1* | 2/2013 | Sapra | H01L 21/3083 257/622 |
| 2014/0084349 | A1* | 3/2014 | Schelling | B81C 1/00182 257/254 |
| 2014/0106494 | A1 | 4/2014 | Bedell et al. | |
| 2015/0125111 | A1* | 5/2015 | Orcutt | G02B 6/136 385/14 |
| 2015/0145043 | A1* | 5/2015 | Huang | H01L 23/66 257/347 |
| 2015/0187793 | A1* | 7/2015 | Huang | H01L 27/1203 257/348 |
| 2016/0047781 | A1 | 2/2016 | Koley | |
| 2016/0329438 | A1* | 11/2016 | Pawashe | H01L 29/161 |
| 2016/0336214 | A1* | 11/2016 | Petzold | H01L 29/78648 |
| 2017/0352618 | A1* | 12/2017 | Fitzsimmons | H01L 28/40 |
| 2018/0083098 | A1* | 3/2018 | Goktepeli | H01L 27/1203 |
| 2018/0113092 | A1 | 4/2018 | Solomon et al. | |
| 2018/0148320 | A1* | 5/2018 | Yang | B81B 7/0041 |
| 2018/0174982 | A1* | 6/2018 | Christiansen | H01L 23/53257 |
| 2019/0013382 | A1* | 1/2019 | Stamper | H01L 23/66 |
| 2020/0144369 | A1* | 5/2020 | Lin | H01L 27/1203 |

OTHER PUBLICATIONS

Y. Jiang et al., "A 512x576 65-nm CMOS ISFET sensor for food safety screening with 123.8 mV/pH sensitivity and 0.01 pH resolution," 2016 IEEE Symposium on VLSI Technology, Honolulu, HI, 2016, pp. 1-2.

S. Kim et al., "Low-Subthreshold-Slope Asymmetric Double-Gate GaAs-on-Insulator Field-Effect-Transistors on Si," in IEEE Electron Device Letters, vol. 37, No. 10, pp. 1261-1263, Oct. 2016.

S. Prakash et al, "Nanofluidics: Systems and Applications," in IEEE Sensors Journal, vol. 8, No. 5, pp. 441-450, May 2008.

G. Fiori et al., "A Three-Dimensional Simulation Study of the Performance of Carbon Nanotube Field-Effect Transistors With Doped Reservoirs and Realistic Geometry," in IEEE Transactions on Electron Devices, vol. 53, No. 8, pp. 1782-1788, Aug. 2006.

* cited by examiner

SENSORS WITH A FRONT-END-OF-LINE SOLUTION-RECEIVING CAVITY

BACKGROUND

The invention relates generally to semiconductor device and integrated circuit fabrication and, in particular, to structures including transistor-based sensors and related fabrication methods.

Sensors based on ion-sensitive field effect transistors can be integrated into chip manufacturing processes and can be used to detect and measure various aspects of chemical reactions and substance properties. For example, an ion-sensitive field effect transistor may be used as a sensor in an integrated circuit to measure ion concentrations, such as hydrogen ion concentration, in a sample of an analyte solution. An ion-sensitive field effect transistor has a construction that is similar to a metal-oxide-semiconductor field-effect transistor. In some popular designs, an ion-sensitive layer may be placed over the channel region of the ion-sensitive field-effect transistor instead of a gate electrode, and the analyte solution is introduced into a cavity that is arranged over, and in communication with, the ion-sensitive layer. An operating characteristic of the ion-sensitive field-effect transistor may be measured and used to calculate ion concentration in the analyte solution wetting the ion-sensitive layer. For example, when the ion concentration in the analyte solution changes, the source-drain current through the ion-sensitive field-effect transistor may change as a function of the changing ion concentration.

The solution-receiving cavity of the ion-sensitive field effect transistor may be incorporated into a modified back-end-of-line structure. Modifications to the back-end-of-line structure to accommodate the cavity tend to be costly because a large area must be reserved in the back-end-of-line structure for the formation of the cavity. In addition, packaging from the front-side of the wafer is needed in order to permit the analyte solution to be received in the cavity.

Improved structures for transistor-based sensors and related fabrication methods are needed.

SUMMARY

In an embodiment of the invention, a structure for a sensor is provided. The structure includes a layer stack having a semiconductor layer and a cavity, a transistor having a gate electrode over the semiconductor layer and the cavity, and an interconnect structure over the layer stack and the transistor. The interconnect structure includes a plurality of metallization levels. The structure further includes a first opening and a second opening each extending through the metallization levels of the interconnect structure and the semiconductor layer to the cavity. The first opening defines a fluid inlet coupled to the cavity, and the second opening defines a fluid outlet coupled to the cavity.

In an embodiment of the invention, a method includes forming a semiconductor layer over a substrate, forming a transistor including a gate electrode over the semiconductor layer, forming an interconnect structure over the semiconductor layer and the substrate, forming a first opening and a second opening extending in a vertical direction through metallization levels of the interconnect structure and the semiconductor layer to a sacrificial layer beneath the semiconductor layer, and removing the sacrificial layer with an etching process to define a cavity. The first opening defines a fluid inlet coupled to the cavity, and the second opening defines a fluid outlet coupled to the cavity.

BRIEF DESCRIPTION OF THE DRAWINGS

The accompanying drawings, which are incorporated in and constitute a part of this specification, illustrate various embodiments of the invention and, together with a general description of the invention given above and the detailed description of the embodiments given below, serve to explain the embodiments of the invention. In the drawings, like reference numerals refer to like features in the various views.

DETAILED DESCRIPTION

Figure 1:
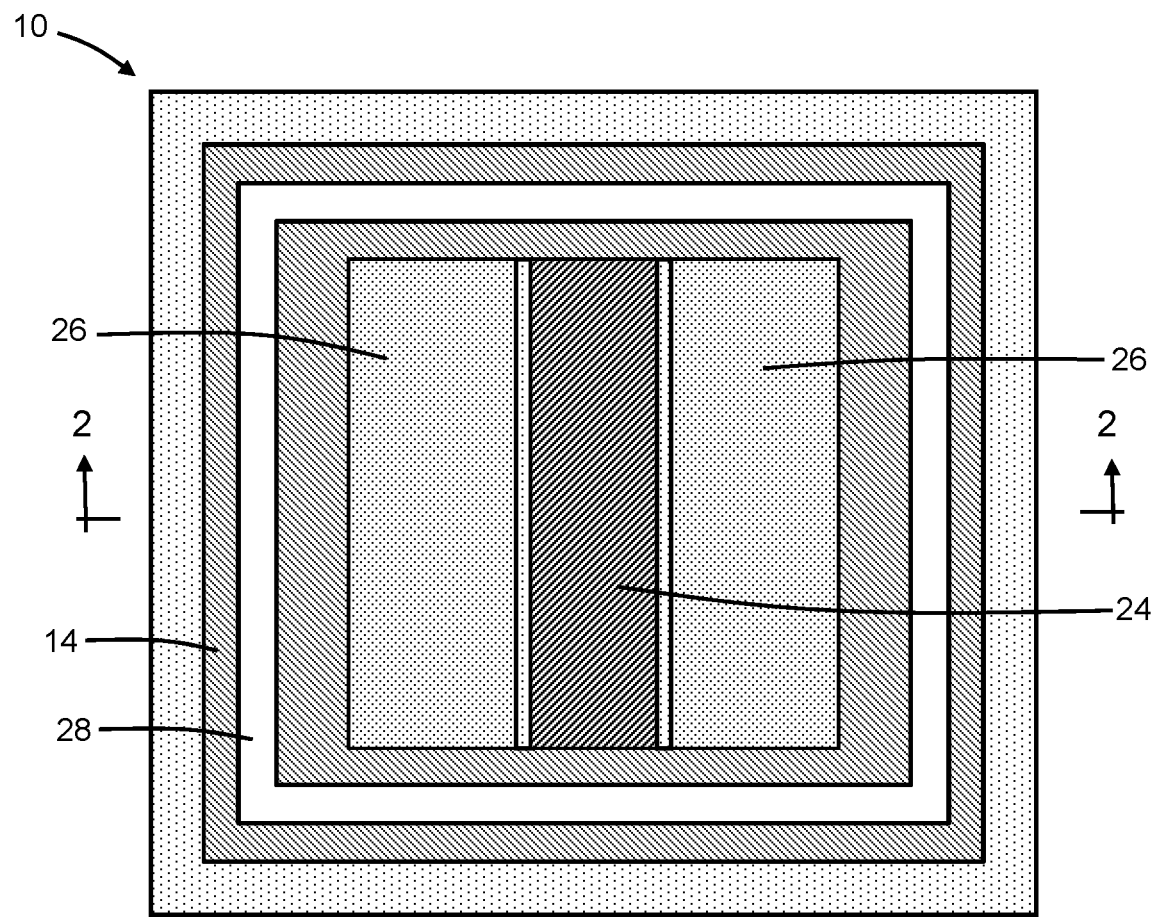
FIG. 1 is top view of a structure for a sensor at an initial fabrication stage of a processing method in accordance with embodiments of the invention.
Figure 2:
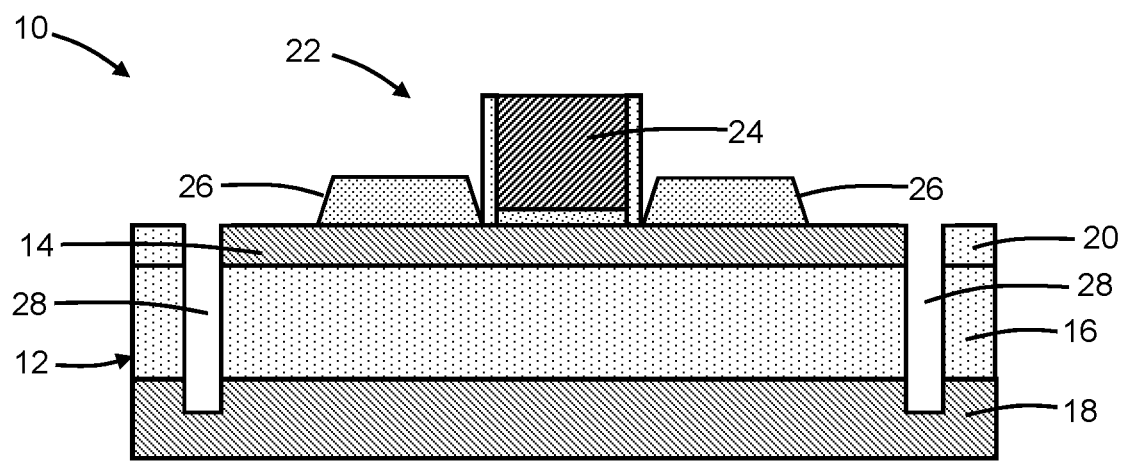
FIG. 2 is a cross-sectional view of the structure taken generally along line 2-2 in FIG. 1.

With reference to FIGS. 1, 2 and in accordance with embodiments of the invention, a structure 10 for a sensor is formed on a wafer 12. In an embodiment, the wafer 12 may be a semiconductor-on-insulator (SOI) wafer. The wafer 12 includes a device layer 14 used to fabricate a field-effect transistor 22, a buried insulator layer 16 in the form of a buried oxide (BOX) layer, and a substrate 18. The device layer 14 is separated from the substrate 18 by the intervening buried insulator layer 16 and is considerably thinner than the substrate 18. The device layer 14 and the substrate 18 may be composed of a single-crystal semiconductor material, such as single-crystal silicon. In an embodiment, the device layer 14 may have a thickness that ranges from about 3 nanometers (nm) to about 200 nm. In an embodiment, the wafer 12 may be an extremely thin semiconductor-on-insulator (ETSOI) wafer with a thin device layer 14 and a thin buried insulator layer 16, and may be used to fabricate the field-effect transistor 22 as a fully-depleted SOI (FDSOI)

device. In an embodiment, the device layer 14 of the ETSOI wafer may have a thickness in an ultra-thin regime (i.e., about 3 nm to about 10 nm) suitable to manufacture FDSOI devices.

A shallow trench isolation region 20 may be formed that extends through the device layer 14 to the buried insulator layer 16 and that is positioned to surround an active region of the device layer 14 in which a field-effect transistor 22 is fabricated. The shallow trench isolation region 20 may be formed by lithography and etching processes to define a trench in the device layer 14, followed by depositing a dielectric material in the trench, planarizing with chemical mechanical polishing, and recessing with a de-glaze process. The dielectric material may be composed of silicon dioxide deposited by chemical vapor deposition.

The field-effect transistor 22 may be fabricated by front-end-of-line processing using the active region of the device layer 14. The field-effect transistor 22 may include a gate electrode 24 and a gate dielectric formed by depositing a layer stack and patterning the layer stack with photolithography and etching. The gate electrode 24 may be composed of a conductor, such as doped polycrystalline silicon (i.e., polysilicon) or a work function metal, and the gate dielectric may be composed of an electrical insulator, such as silicon dioxide or hafnium oxide. The field-effect transistor 22 may include other elements such as source/drain regions 26, silicide on the source/drain regions 26, halo regions, lightly doped drain (LDD) extensions, and non-conductive sidewall spacers on the gate electrode 24.

A trench 28 is patterned with lithography and etching processes that extends through the device layer 14 in the active region and the buried insulator layer 16. The lithography process may entail forming an etch mask that includes a layer of a light-sensitive material, such as an organic photoresist, applied by a spin coating process, pre-baked, exposed to light projected through a photomask, baked after exposure, and developed with a chemical developer to form an opening over the intended location for the trench 28. The etching process may be a reactive ion etching process, and the etch mask may be stripped by, for example, plasma ashing, followed by a cleaning process.

The trench 28 may surround the active region of the device layer 14 and an underlying section of the buried insulator layer 16. In an embodiment, trench 28 may provide an opening that continuously and fully surrounds the active region of the device layer 14 and the section of the buried insulator layer 16 underlying the active region. In an embodiment, the trench 28 may extend fully through the buried insulator layer 16 to the substrate 18. In an embodiment, the trench 28 may extend fully through the buried insulator layer 16 and also penetrate to a shallow depth into the substrate 18.

Figure 3:
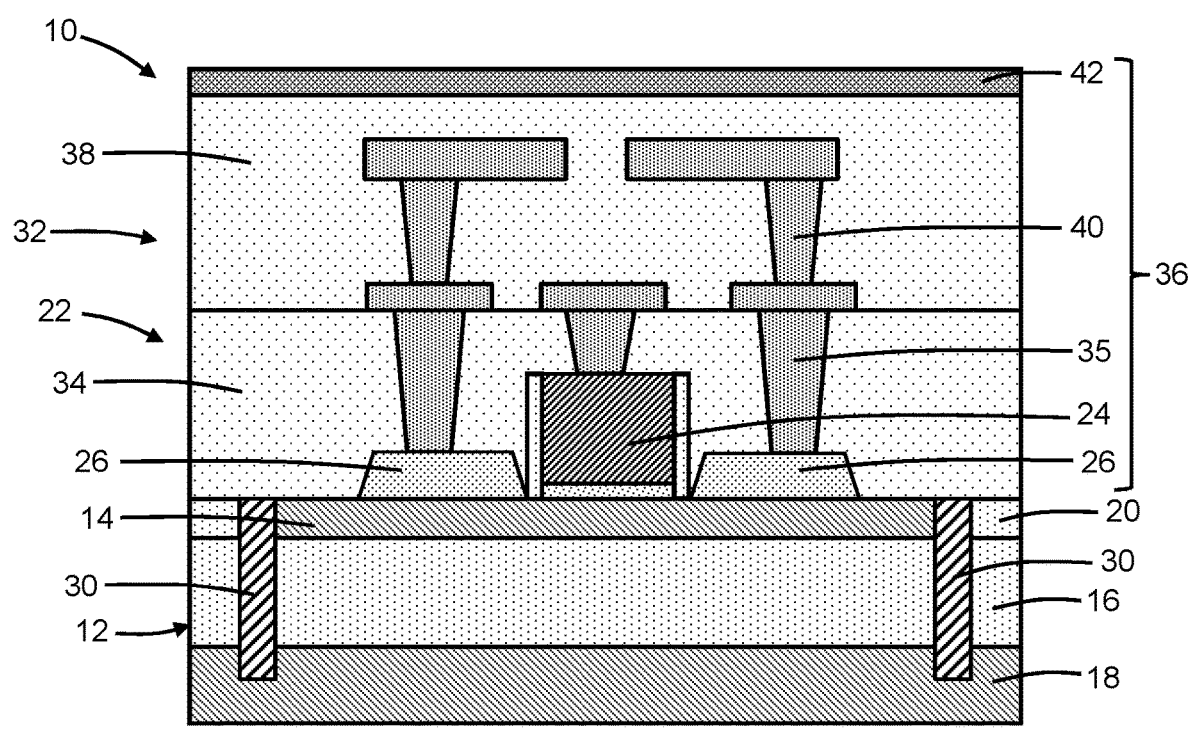
FIG. 3 is a cross-sectional view of the structure at a fabrication stage subsequent to FIG. 2.

With reference to FIG. 3 in which like reference numerals refer to like features in FIGS. 1, 2 and at a subsequent fabrication stage of the processing method, an anchor 30 is formed in the trench 28. The anchor 30 may be formed by filling the trench 28 with a material, such as silicon nitride, aluminum nitride, or aluminum oxide. In an embodiment, the material forming the anchor 30 may be deposited by a conformal deposition technique, such as atomic layer deposition, and may pinch-off in the trench during deposition. In an embodiment, the material forming the anchor 30 may originate from a silicide-blocking layer used in CMOS processing. An etching process may be used to remove the deposited material from the active region of the device layer 14, the field-effect transistor 22, and the shallow trench isolation region 20.

The anchor 30 may surround the active region of the device layer 14 and an underlying section of the buried insulator layer 16. In an embodiment, anchor 30 may continuously and fully surround the active region of the device layer 14 and the underlying section of the buried insulator layer 16. In an embodiment, the anchor 30 is positioned at or near the outer perimeter of the active region of the device layer 14 and the underlying section of the buried insulator layer 16. In an embodiment, the anchor 30 may extend fully through the buried insulator layer 16 and directly contact the substrate 18. In an embodiment, the anchor 30 may extend fully through the buried insulator layer 16 and to a shallow depth into the substrate 18.

Middle-of-line (MOL) processing and back-end-of-line (BEOL) processing follow, which includes formation of metallization for an interconnect structure 32 coupled with the field-effect transistor 22. As an initial part of this processing, a dielectric layer 34 of a contact level of the interconnect structure 32 is formed over the field-effect transistor 22. The dielectric layer 34 may be composed of borophosphosilicate glass or undoped silicate glass deposited by chemical vapor deposition and then polished by chemical-mechanical polishing. Contacts 35, which are formed by middle-of-line processing in the dielectric layer 34, may be coupled with the gate electrode 24 and source/drain regions 26 of the field-effect transistor 22. The contacts 35 may be composed of a metal, such as silicide and/or tungsten, that is formed in contact openings defined by lithography and etching processes in the dielectric layer 34. The interconnect structure 32 may further include metallization levels 36 including one or more interlayer dielectric layers 38 over the dielectric layer 34 and metallization features 40 in the form of vias, metal lines, and/or metal islands that are coupled with the contacts 35. A cap layer 42 composed of a dielectric material, such as silicon nitride, may be located over the one or more interlayer dielectric layers 38. The one or more interlayer dielectric layers 38 may be composed of a dielectric material, such as carbon-doped silicon dioxide, the metallization features 40 may be composed of copper, aluminum, and/or cobalt, and the cap layer 42 may be composed of a dielectric material, such as silicon nitride.

Figure 4:
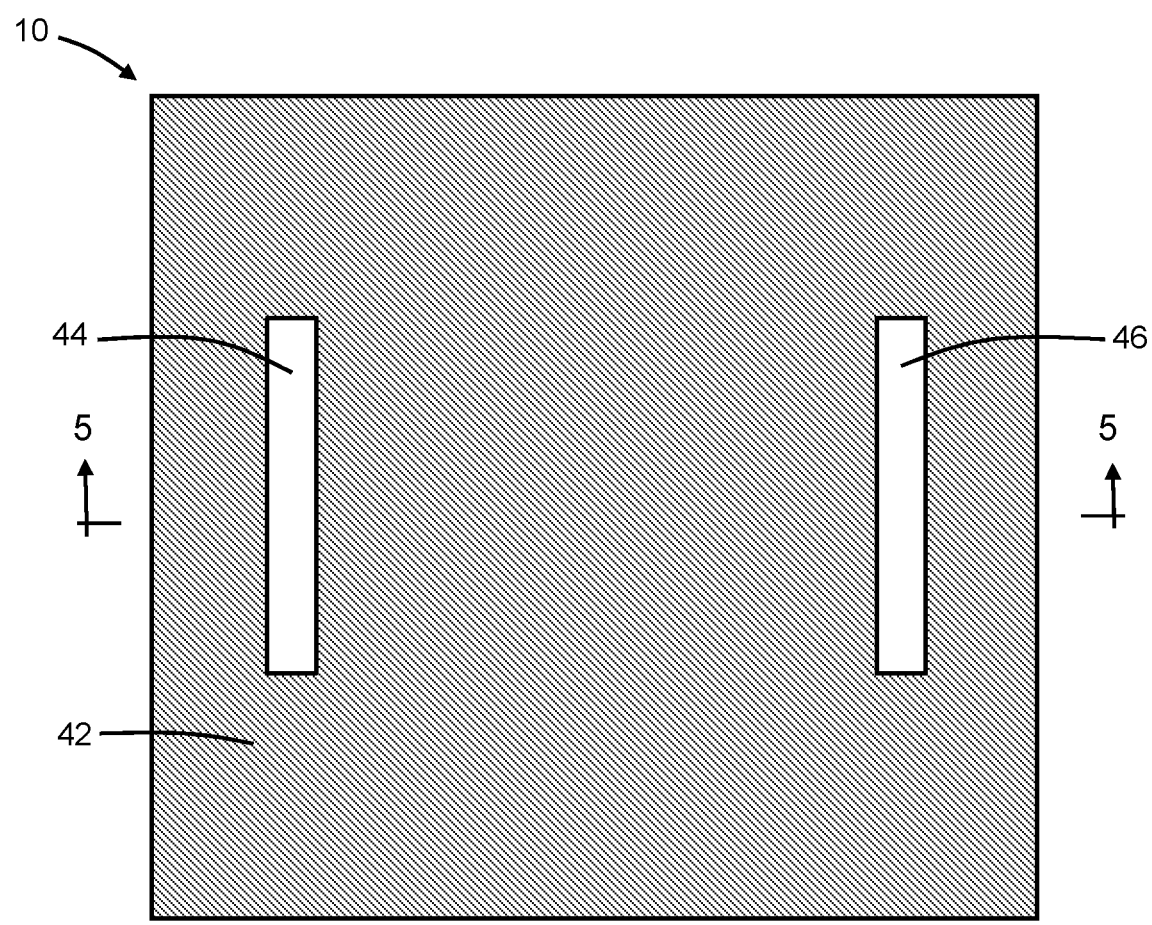
FIG. 4 is top view of the structure at a fabrication stage of the processing method subsequent to FIG. 3.
Figure 5:
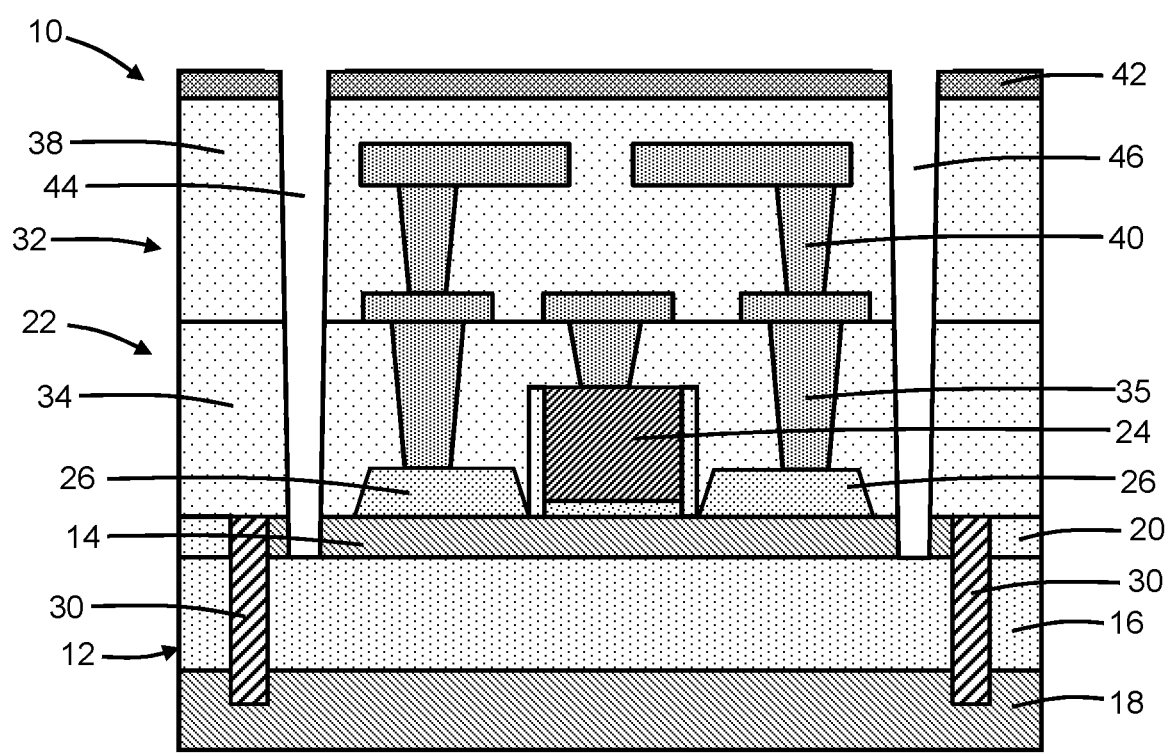
FIG. 5 is a cross-sectional view of the structure taken generally along line 5-5 in FIG. 4.

With reference to FIGS. 4, 5 in which like reference numerals refer to like features in FIG. 3 and at a subsequent fabrication stage of the processing method, openings 44, 46 are formed by lithography and etching processes that extend through the interconnect structure 32 to the buried insulator layer 16. The lithography process may entail forming an etch mask that includes a layer of a light-sensitive material, such as an organic photoresist, applied by a spin coating process, pre-baked, exposed to light projected through a photomask, baked after exposure, and developed with a chemical developer to form an opening over the intended locations for the openings 44, 46. The etching process may be one or more reactive ion etching processes, and the etch mask may be stripped by, for example, plasma ashing, followed by a cleaning process. The etching process extending the openings 44, 46 through the device layer 14 may remove the semiconductor material of the device layer 14 selective to the dielectric material of the buried insulator layer 16 such that the buried insulator layer 16 operates as an etch stop and the openings 44, 46 terminate at the buried insulator layer 16. As used herein, the term "selective" in reference to a material removal process (e.g., etching) denotes that, with an appropriate etchant choice, the material removal rate (i.e., etch rate) for the targeted material is greater than the removal rate for at least another material exposed to the material removal process.

The openings 44, 46 extend in a vertical direction through the cap layer 42, the one or more interlayer dielectric layers 38 of the metallization levels 36, and the dielectric layer 34 to the device layer 14. The openings 44, 46 may then be extended by another etching process, such as a reactive ion etching process, through the semiconductor material of the active region of the device layer 14. The etch mask may be stripped by, for example, plasma ashing, following by a cleaning process.

The openings 44, 46 and, in particular, the portion of each of the openings 44, 46 in the device layer 14 are positioned interior of the anchor 30 such that the openings 44, 46 are fully surrounded by the anchor 30. The field-effect transistor 22 is laterally positioned between the opening 44 and the opening 46.

Figure 6:
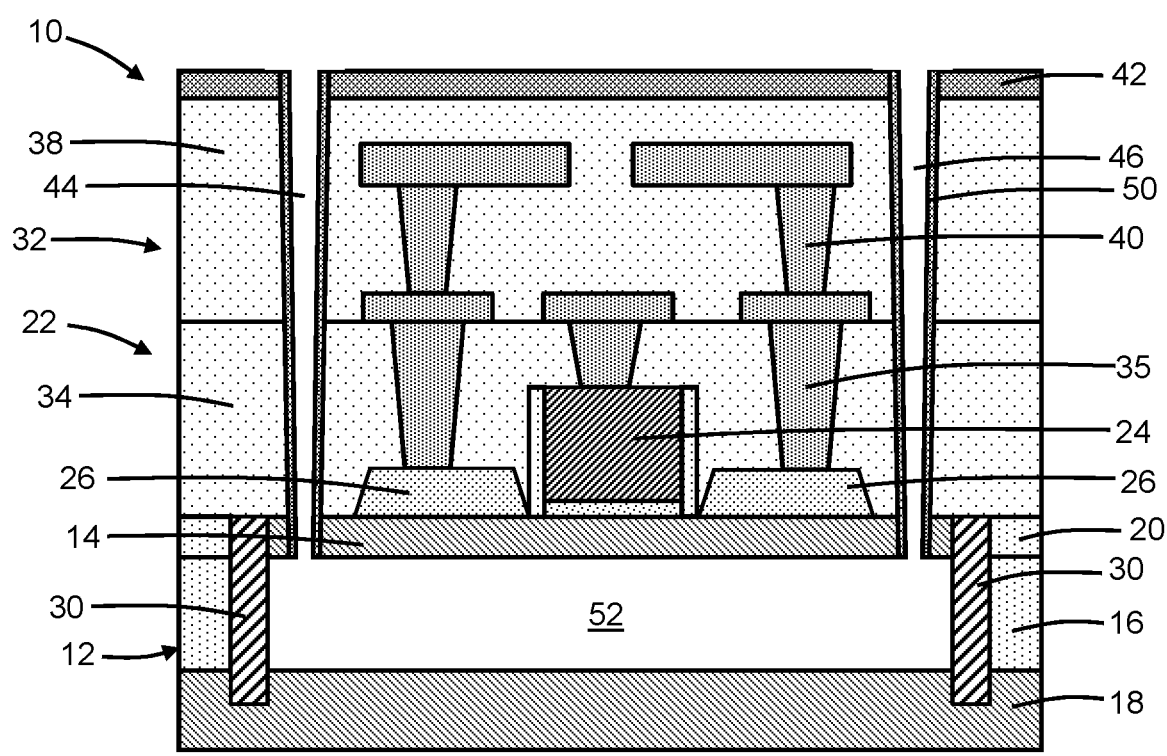
FIG. 6 is a cross-sectional view of the structure at a fabrication stage of the processing method subsequent to FIG. 5.

With reference to FIG. 6 in which like reference numerals refer to like features in FIGS. 4, 5 and at a subsequent fabrication stage of the processing method, a liner 50 is applied that coats the surfaces of the cap layer 42, one or more interlayer dielectric layers 38 of the metallization levels 36, dielectric layer 34, and active region of the device layer 14 bordering and surrounding the openings 44, 46. The liner 50 may composed of a dielectric material, such as silicon nitride. Alternatively, the liner 50 may composed of aluminum nitride or aluminum oxide. The liner 50 has sections in each of the openings 44, 46, and these sections are respectively positioned in part between the active region of the device layer 14 and the openings 44, 46.

After forming the liner 50, a cavity 52 is formed beneath the active region of the device layer 14 and the field-effect transistor 22 by removing the section of the buried insulator layer 16 interior of the anchor 30 with an etching process. The cavity 52 may be formed by an isotropic etching process directing a wet chemical etchant into the openings 44, 46. In an embodiment, the wet chemical etchant may be a solution containing hydrofluoric acid. In an alternative embodiment, the cavity 52 may be formed by an isotropic dry etching process, for example if the liner 50 is composed of aluminum nitride or aluminum oxide. The liner 50 is absent from the cavity 52 because, at least in part, the cavity 52 is formed after the liner 50 is formed and therefore, the sections of the liner 50 inside the openings 44, 46 respectively terminate at the cavity 52.

In an embodiment, the section of the buried insulator layer 16 beneath the active region of the device layer 14 and the field-effect transistor 22 may be fully removed interior of the anchor 30 by the etching process to form the cavity 52. The buried insulator layer 16 may be removed selective to the semiconductor materials of the device layer 14 and the substrate 18 such that the cavity 52 acquires the shape of the section of the buried insulator layer 16 that is removed. The buried insulator layer 16 may also be removed selective to the material of the anchor 30 such that the anchor 30 provides an etch stop for the etching process and defines or delimits an outer boundary of the cavity 52. The buried insulator layer 16 may also be removed selective to the material of the liner 50 such that the liner 50 functions to protect the one or more interlayer dielectric layers 38 of the metallization levels 36 and the dielectric layer 34 during the etching process.

Non-removed sections of the buried insulator layer 16 and the anchor 30 each surround the cavity 52 with the anchor 30 located between the cavity 52 and the non-removed sections of the buried insulator layer 16. The anchor 30 is laterally positioned between, and adjacent to, the cavity 52 and the shallow trench isolation region 20. The anchor 30 is also laterally positioned between, and adjacent to, the active region of the device layer 14 and the shallow trench isolation region 20. The cavity 52 may have a height equal to the thickness of the removed section of the buried insulator layer 16, and may terminate at the anchor 30 that defines its surrounding outer boundary.

The semiconductor layer defined by the active region of the device layer 14 and the cavity 52 define respective portions of the layer stack. The transistor 22 including its gate electrode 24 is positioned over the layer stack, and the interconnect structure 32 is positioned over the layer stack and the transistor 22. The active region of the device layer 14 is positioned between the gate electrode 24 of the transistor 22 and the cavity 52.

The structure 10 may be packaged using a cap wafer (not shown) with a redistribution layer and through-silicon vias that reroute connections with pads formed in the cap layer 42 and coupled with the metallization levels 36. The cap wafer may include passages that respectively are in fluid communication with the openings 44, 46 for supplying the solution to the structure 10 and removing the solution from the structure 10.

The openings 44, 46 may be used in the structure 10, during its operation as a sensor, as inlets/outlets for fluid circulation into the cavity 52. One of the openings 44, 46 may be used as a fluid inlet for fluid ingress and the other of the openings 44, 46 may be used as a fluid outlet for fluid egress. The cavity 52 may be used in the structure 10, during its operation as a sensor, as a fluid reservoir for an electrolyte or solution containing charged ions or charged particles that is being circulated through the structure 10 using the openings 44, 46 for analysis of some property or characteristic (for example, ion concentration). In contrast to conventional sensors in which the cavities for solution circulation are formed in the back-end-of-line structure, the cavity 52 is formed in a portion of the structure 10 that is fabricated by front-end-of-line processing. This relocation of the cavity 52 may reduce the impact on the footprint of the structure 10 within the chip. The sensor provided by the structure 10 may be used in a variety of practical sensing applications, such chemical, biochemical, and magnetic applications. As examples, the sensor provided by the structure 10 may be used for pH sensing such as acidity monitoring in blood or pH determinations of saliva, DNA detection, or DNA separation. The sensor provided by the structure 10 may be implemented without the need for micro-electro-mechanical systems (MEMS) mechanical and/or electro-mechanical elements.

Figure 6A:
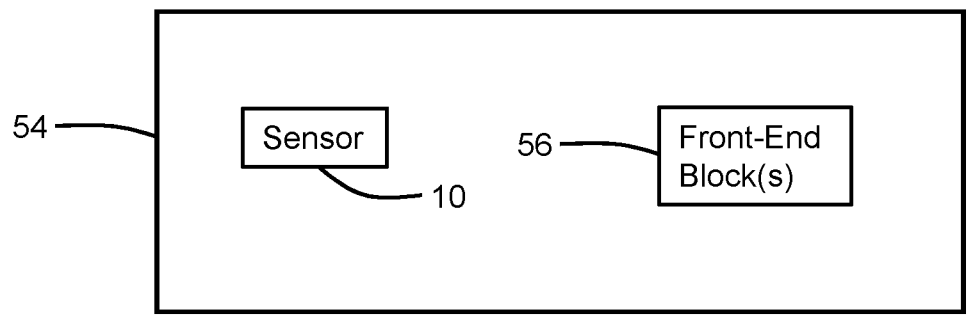
FIG. 6A is a diagrammatic view of a chip including the sensor structure and one or more additional front-end-of-line blocks.

The structure 10 may be fully integrated in a chip 54 (FIG. 6A) with other circuits formed using the SOI wafer. For example, the structure 10 may be included as part of an internet-of-things (IOT) chip. The chip 54 may also integrate other components, such as switches, filters, duplexers, analog-to-digital controllers, digital-to-analog controllers, a microcontroller, etc., as front-end-of-line blocks. For example, the structure 10 may be integrated into a monolithic structure with one or more front-end blocks 56, such as logic, a power amplifier, and/or a low-noise amplifier, that are located on the same wafer and chip 54 as the structure 10. For example, a front-end-of-line block 56 may include field-effect transistors similar to the field-effect transistor 22 as shown in FIGS. 1, 2, but without the subsequently-formed openings 44, 46 and cavity 52.

Figure 6B:
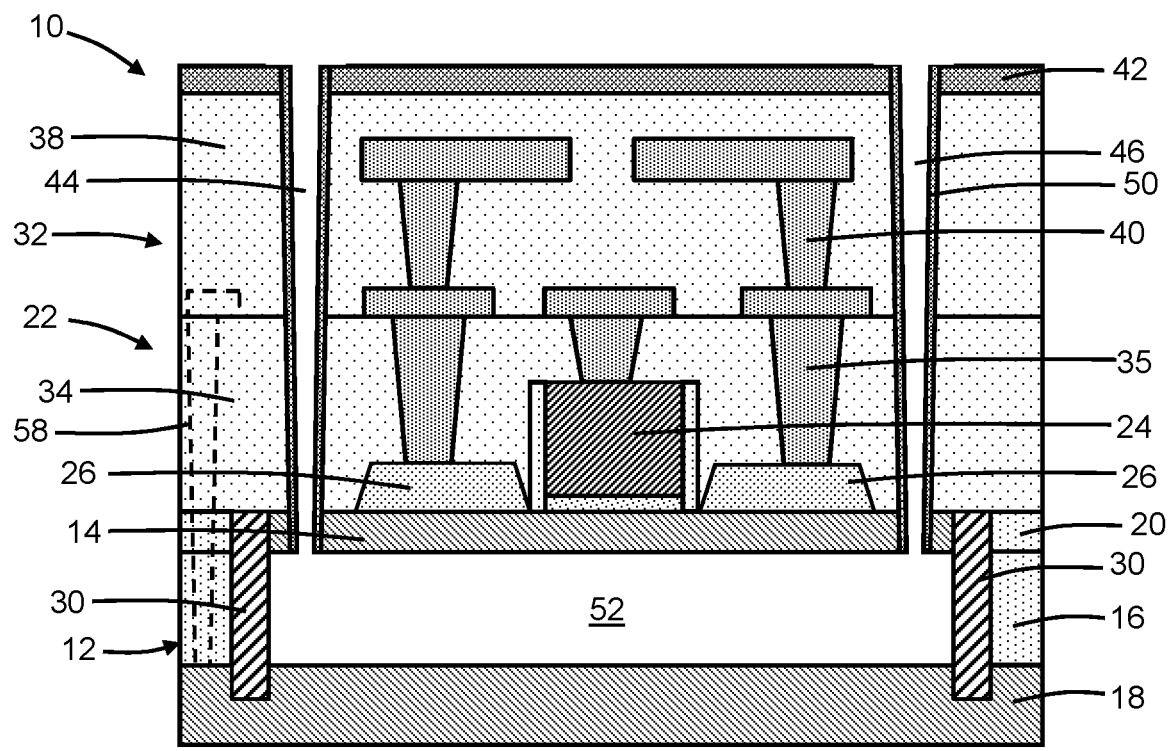
FIG. 6B is a cross-sectional view of a structure in accordance with an alternative embodiment.

In an alternative embodiment and as shown in FIG. 6B, the section of the substrate 18 of the SOI wafer 12 extending beneath the field-effect transistor 22 and cavity 52 may be contacted and biased during operation of the structure 10 to provide the field-effect transistor 22 with a back gate. During operation, fluid from the solution added to the cavity 52 provides an effective gate dielectric for the back gate. A contact 58 to the back gate may be formed that extends through the buried insulator layer 16 to the substrate 18. The contact 58 may be coupled to metallization features 40 in the interconnect structure 32 in order to supply the bias voltage to the back gate during operation.

In an alternative embodiment, the wafer 12 may be a bulk substrate in which the device layer 14 is positioned over a sacrificial layer composed of a semiconductor material with etch selectivity to the semiconductor material of the device layer 14, instead of a dielectric material with etch selectivity to the semiconductor material of the device layer 14. The sacrificial layer replaces the buried insulator layer 16 of the SOI wafer in the layered arrangement. The device layer 14 and the sacrificial layer may be formed using an epitaxial growth process, and may include single-crystal semiconductor material epitaxially grown from the bulk substrate using the crystal structure of the bulk substrate as a growth template. In an embodiment, the single-crystal semiconductor material of the device layer 14 may lack germanium and, in an embodiment, may be composed entirely of silicon. In an embodiment, the single-crystal semiconductor material of the sacrificial layer may be composed of silicon-germanium (SiGe) including silicon and germanium combined in an alloy with the silicon content ranging from 95 atomic percent to 50 atomic percent and the germanium content ranging from 5 atomic percent to 50 atomic percent. During epitaxial growth, the composition of the device layer 14 and the sacrificial layer may be modulated by exerting control over the deposition conditions. For a bulk wafer, the sacrificial layer may be composed of a dielectric material, such as a deposited or grown silicon dioxide. Processing continues as described previously in connection with FIGS. 4-6. As part of the processing, the sacrificial layer is removed with an etching process selective to the materials of the device layer 14, substrate 18, and anchor similar to the removal of the section of the buried insulator layer 16.

Figure 7:
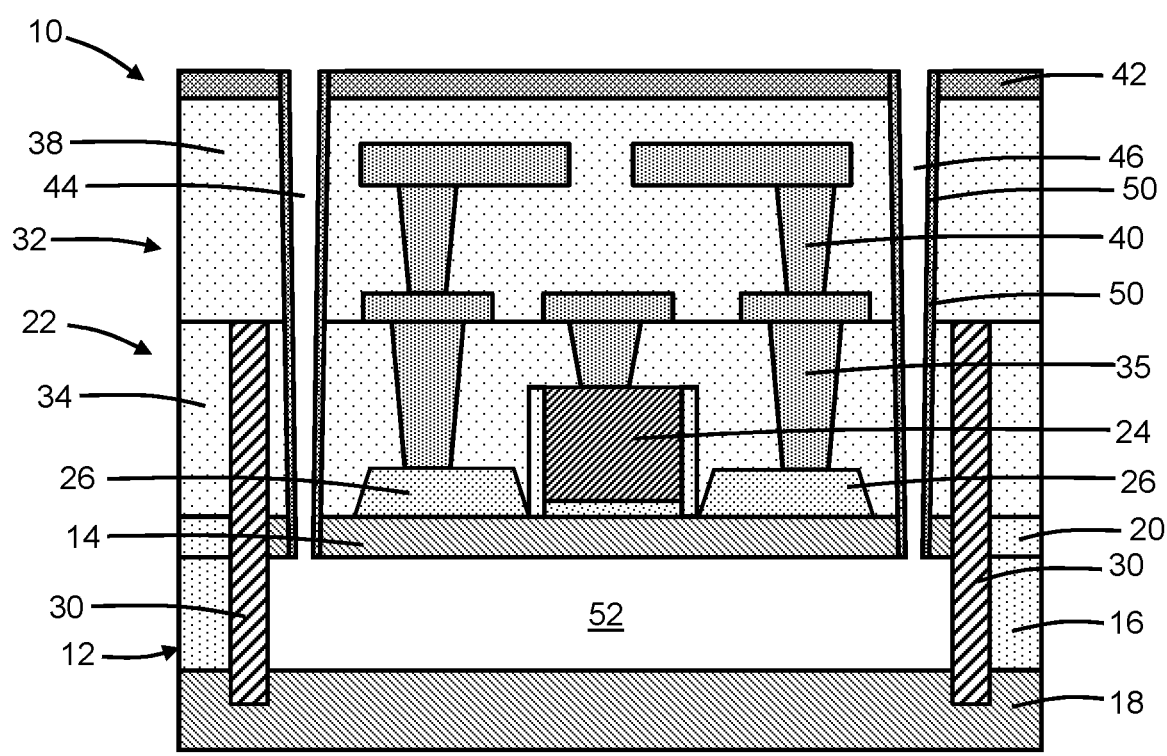
FIG. 7 is a cross-sectional view of a structure for a sensor in accordance with alternative embodiments of the invention.

With reference to FIG. 7 in which like reference numerals refer to like features in FIG. 6 and in accordance with an alternative embodiment, the trench 28 (FIGS. 1, 2) and the anchor 30 may be formed after forming the dielectric layer 34 of the contact level of the interconnect structure 32. The anchor 30 is therefore formed after middle-of-line processing and extends vertically through the buried insulator layer 16 in addition to the device layer 14 and the buried insulator layer 16. Processing continues to form the metallization levels 36 and cap layer 42 of the interconnect structure 32, followed by the formation of the openings 44, 46 and the cavity 52 as previously described.

Figure 8:
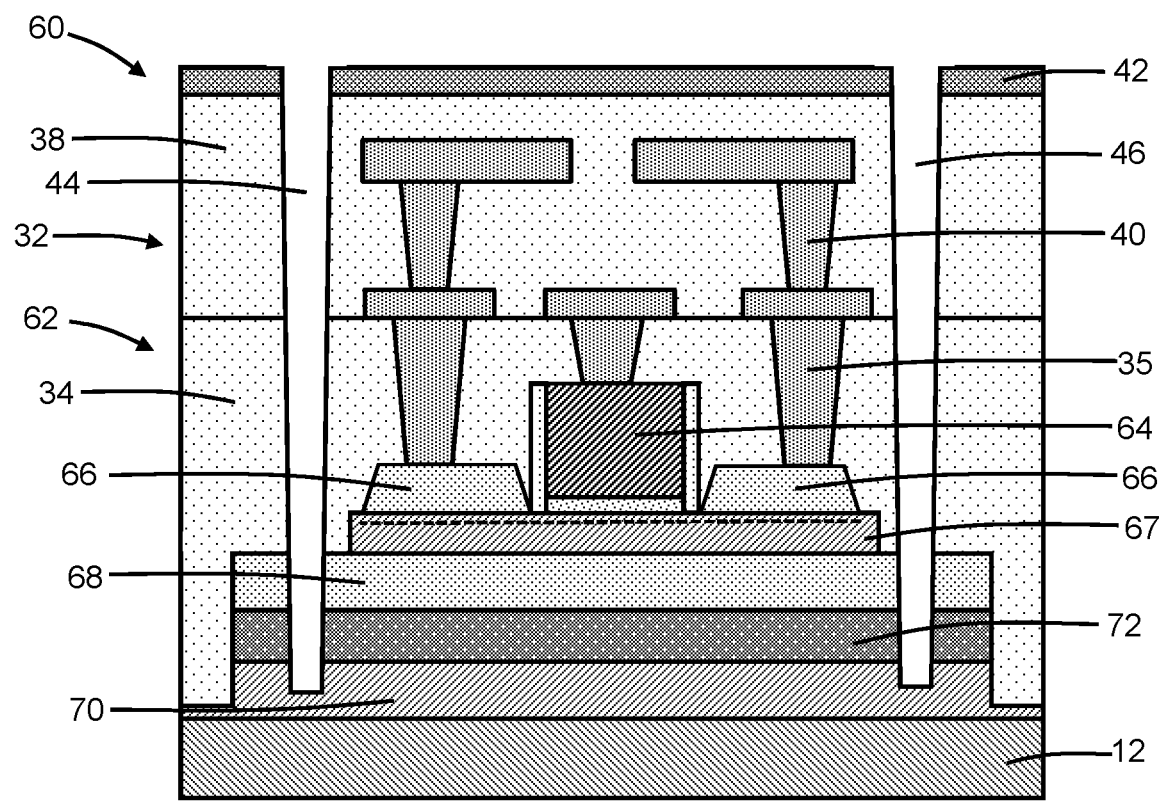
FIGS. 8-9 are cross-sectional views of a structure for a sensor at successive fabrication stages of a processing method in accordance with alternative embodiments of the invention.

With reference to FIG. 8 and in accordance with alternative embodiments, a structure 60 for a sensor is formed on the wafer 12. The structure 60 may be based on a different type of transistor 62 than the field-effect transistor 22. In an embodiment, the transistor 62 may be a high-electron-mobility transistor (HEMT) that is based on III-V semiconductor materials. In particular, the transistor 62 may include a gate electrode 64 and source/drain regions 66 that are located over a channel layer 68 and a buffer layer 70. The buffer layer 70 is located below the channel layer 68 in a layer stack. The transistor 62 is included in a raised mesa that is surrounded by the dielectric material of the one or more interlayer dielectric layers 38 of the metallization levels 36 of interconnect structure 32. Dopant from the source/drain regions 66 may diffuse into a layer 67 located below the gate electrode 64 or the source/drain regions 66 may be grown from surfaces of respective cavities defined in the layer 67. In alternative embodiments, the transistor 62 may be a metal-semiconductor field-effect transistor (MESFET) or a metal-oxide-semiconductor field-effect transistor (MOSFET).

A sacrificial layer 72 is positioned between the channel layer 68 and the buffer layer 70 in the layer stack. The layers 67, 68, 70, 72 may be formed using an epitaxial growth process, and may include single-crystal semiconductor material epitaxially grown from the wafer 12 using the crystal structure of the wafer 12 as a growth template. In an embodiment, the layers 67, 68, 70, 72 may each be composed of a single-crystal Group III-Group V (III-V) semiconductor material. In an embodiment, the layers 68 and 70 may be composed of a binary III-V semiconductor material, and the sacrificial layer 72 may be composed of a ternary or quaternary III-V semiconductor material. In an embodiment, the layers 68 and 70 may be composed of gallium arsenide, and the sacrificial layer 72 may be composed of aluminum gallium arsenide. The specific semiconductor material of the sacrificial layer 72 is selected to be removed selective to the semiconductor materials of the layers 68 and 70 so as to permit cavity formation during subsequent processing. The etch selectivity may arise from differences in alloy composition.

Figure 9:
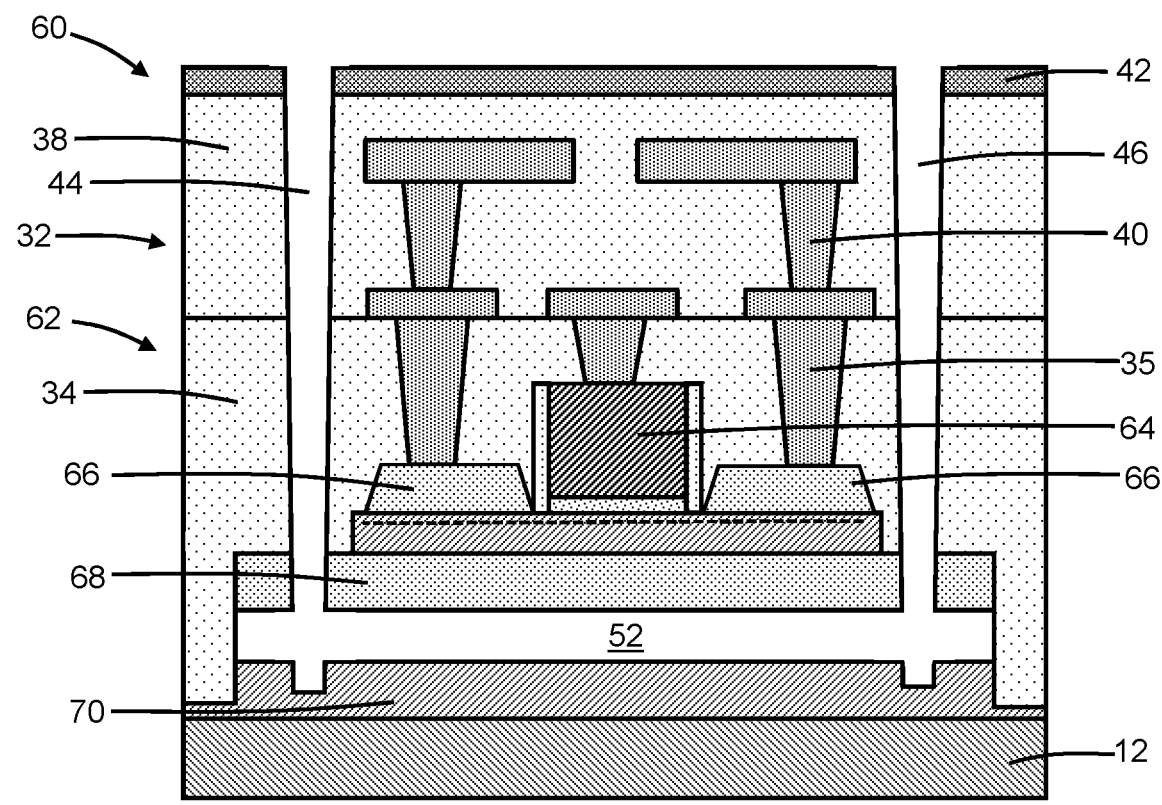

With reference to FIG. 9 in which like reference numerals refer to like features in FIG. 8 and at a subsequent fabrication stage of the processing method, the openings 44, 46 and the cavity 52 are formed as previously described. The openings 44, 46 extend through the interconnect structure 32 and the channel layer 68 and penetrate into the sacrificial layer 72. In the representative embodiment, the openings 44, 46 may extend fully through the channel layer 68 and sacrificial layer 72 and penetrate into the buffer layer 70. Following the formation of the openings 44, 46, a cavity 52 is formed by removing the sacrificial layer 72 selective to the layers 68, 70. The dielectric material of the one or more interlayer dielectric layers 38 provides an etch stop at the outer boundary of the cavity 52. An anchor is not required during the etching process because the dielectric material of the one or more interlayer dielectric layers 38 functions as an etch stop. An anchor is not required during the etching process due to the etch selectivity between the sacrificial layer 72 and the layers 68 and 70 that permits the selective removal of the sacrificial layer 72.

The semiconductor layer defined by the channel layer 68 and the cavity 52 define respective portions of the layer stack. The transistor 62 including its gate electrode 64 is positioned over the layer stack, and the interconnect structure 32 is positioned over the layer stack and the transistor 62. The channel layer 68 is positioned between the gate electrode 64 of the transistor 62 and the cavity 52.

Figure 10:
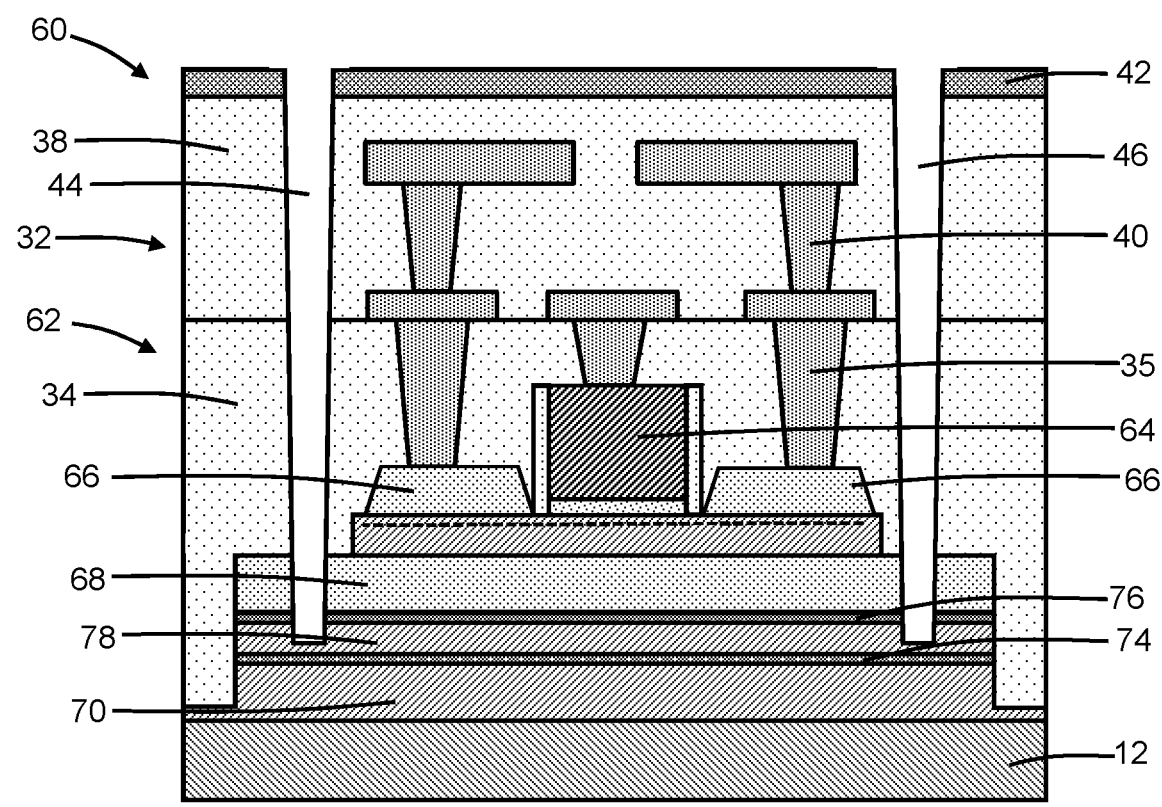
FIGS. 10-11 are cross-sectional views of a structure for a sensor at successive fabrication stages of a processing method in accordance with alternative embodiments of the invention.

With reference to FIG. 10 and in accordance with alternative embodiments, the structure 60 may include a sacrificial layer 78 and additional layers 74, 76 that operate as etch stops during the removal of the sacrificial layer 78. The layers 68, 70, 74, 76, 78 may be formed using an epitaxial growth process, and may include single-crystal semiconductor material epitaxially grown from the wafer 12 using the crystal structure of the wafer 12 as a growth template. In an embodiment, the single-crystal semiconductor material of the layers 68, 70, 74, 76, 78 may each be composed of a Group III-Group V (III-V) semiconductor material. In an embodiment, the layers 68, 70, 78 may be composed of a binary III-V semiconductor material, and the layers 74, 76 may be composed of a ternary or quaternary III-V semiconductor material. In an embodiment, the layers 68, 70, 78 may be composed of gallium arsenide, and the layers 74, 76 may be composed of aluminum gallium arsenide. The specific semiconductor material of the layers 74, 76 is selected to permit the sacrificial layer 78 to be removed, as described previously, selective to the semiconductor materials of the layers 74, 76 so as to permit cavity formation during subsequent processing. The etch selectivity may arise from differences in composition and/or differences in doping.

The openings 44, 46 are formed as previously described. The openings 44, 46 extend through the interconnect structure 32 and the layers 70 and 76 and penetrate into the sacrificial layer 78 underlying the layer 76. The openings 44, 46 terminate within the sacrificial layer 78 between the layer 74 and the layer 76, and without penetrating into or through the layer 74.

Figure 11:
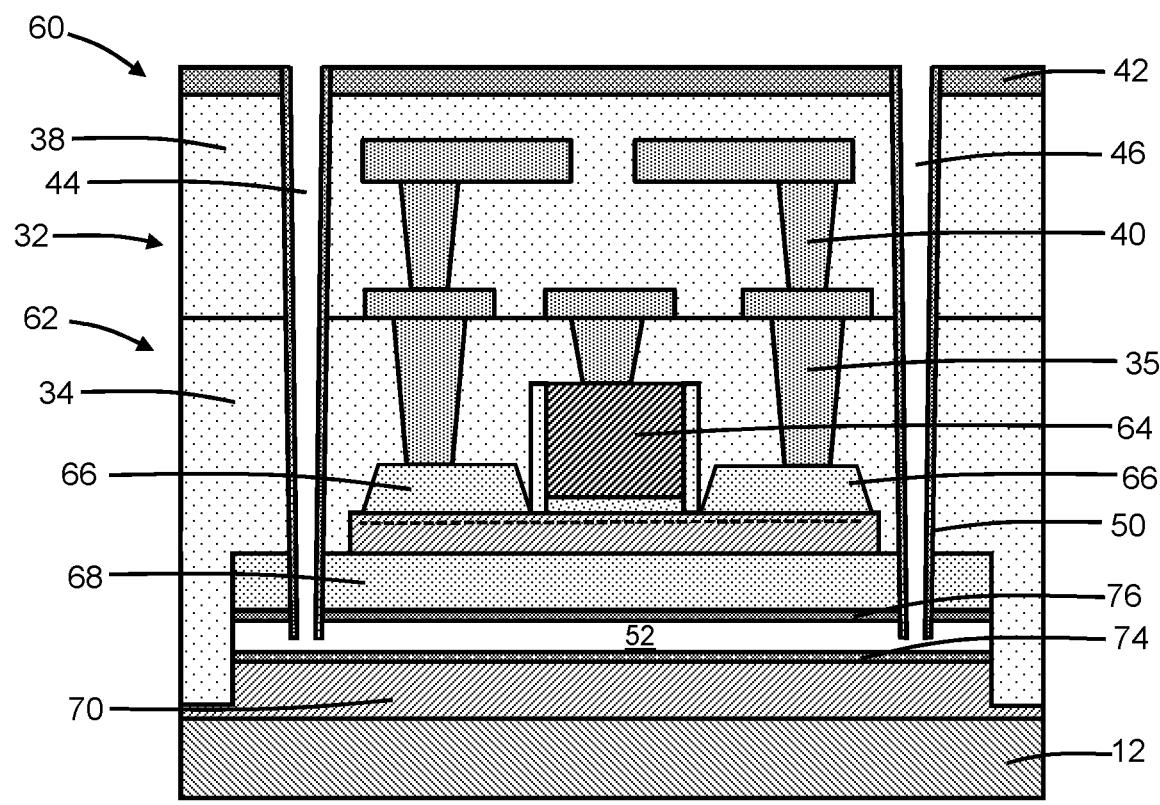

With reference to FIG. 11 in which like reference numerals refer to like features in FIG. 10 and at a subsequent fabrication stage of the processing method, the liner 50 is applied to the openings 44, 46 following the formation of the openings 44, 46. The cavity 52 is formed by removing the sacrificial layer 78 selective to the layers 74, 76. The dielectric material of the one or more interlayer dielectric layers 38 provides an etch stop at the lateral outer boundary of the cavity 52, and the semiconductor material of the layers 74, 76 provide an etch stop at the upper and lower boundaries of the cavity 52. The liner 50 protects the semiconductor material of the layer 68 against etching during formation of the openings 44, 46 and during formation of the cavity 52. An anchor is not required during the etching process because the dielectric material of the one or more interlayer dielectric layers 38 function as an etch stop.

Figure 12:
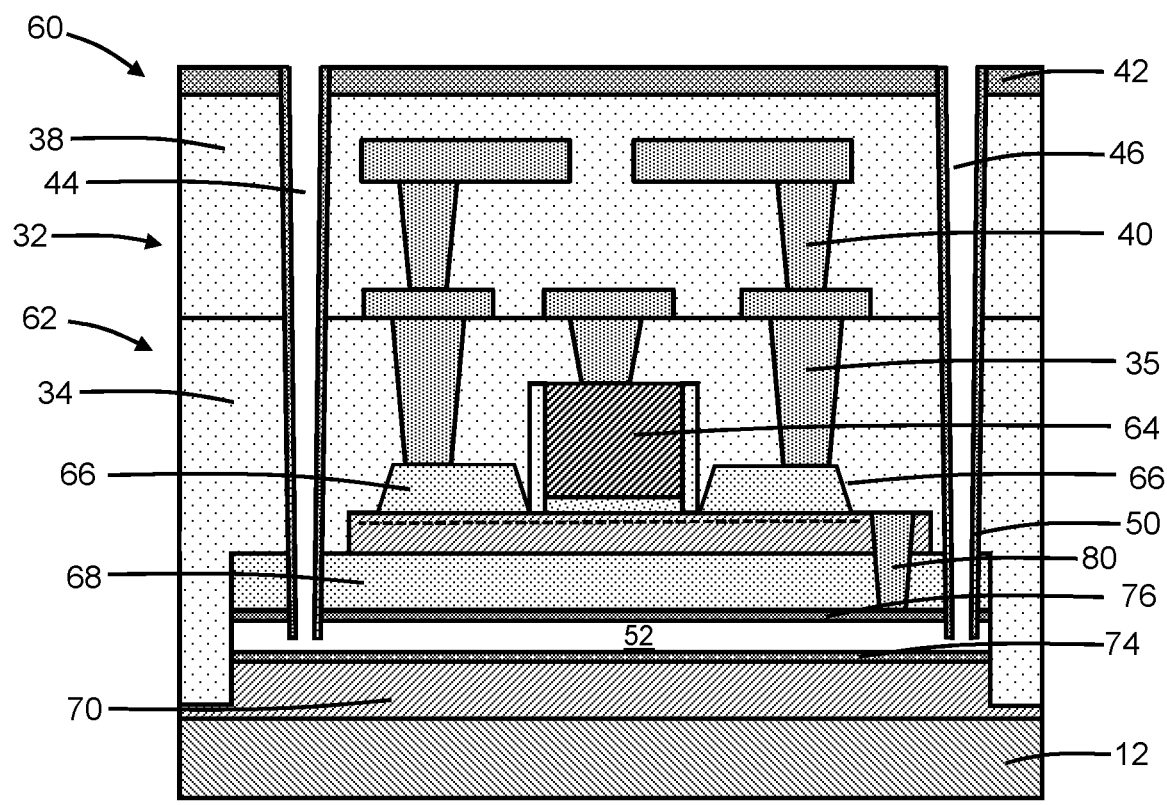
FIG. 12 is a cross-sectional view of a structure for a sensor in accordance with alternative embodiments of the invention.

The channel layer 68 over the cavity 52 may provide a high bandgap material that can be contacted and used as a back gate, as shown in FIG. 12. During operation, a bias voltage may be applied to the channel layer 68 through a contact 80 that is coupled with the channel layer 68.

The embodiments described herein may reduce the cost arising from the back-end-of-line placement of a solution-receiving cavity by instead placing the cavity in a front-end-of-line portion of the chip. The embodiments described herein may also reduce the complexity of non-standard packaging solutions and even the need for non-standard packaging solutions.

The methods as described above are used in the fabrication of integrated circuit chips. The resulting integrated circuit chips can be distributed by the fabricator in raw wafer form (e.g., as a single wafer that has multiple unpackaged chips), as a bare die, or in a packaged form. The chip may be integrated with other chips, discrete circuit elements, and/or other signal processing devices as part of either an intermediate product or an end product. The end product can be any product that includes integrated circuit chips, such as computer products having a central processor or smartphones.

References herein to terms modified by language of approximation, such as "about", "approximately", and "substantially", are not to be limited to the precise value specified. The language of approximation may correspond to the precision of an instrument used to measure the value and, unless otherwise dependent on the precision of the instrument, may indicate +/−10% of the stated value(s).

References herein to terms such as "vertical", "horizontal", etc. are made by way of example, and not by way of limitation, to establish a frame of reference. The term "horizontal" as used herein is defined as a plane parallel to a conventional plane of a semiconductor substrate, regardless of its actual three-dimensional spatial orientation. The terms "vertical" and "normal" refer to a direction perpendicular to the horizontal, as just defined. The term "lateral" refers to a direction within the horizontal plane.

A feature "connected" or "coupled" to or with another feature may be directly connected or coupled to or with the other feature or, instead, one or more intervening features may be present. A feature may be "directly connected" or "directly coupled" to or with another feature if intervening features are absent. A feature may be "indirectly connected" or "indirectly coupled" to or with another feature if at least one intervening feature is present. A feature "on" or "contacting" another feature may be directly on or in direct contact with the other feature or, instead, one or more intervening features may be present. A feature may be "directly on" or "in direct contact with" another feature if intervening features are absent. A feature may be "indirectly on" or "in indirect contact with" another feature if at least one intervening feature is present.

The descriptions of the various embodiments of the present invention have been presented for purposes of illustration, but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments disclosed herein.

What is claimed is:

1. A structure for a sensor, the structure comprising:
a substrate;
a layer stack including a first semiconductor layer and a cavity, the first semiconductor layer positioned over the cavity, and the cavity positioned between the first semiconductor layer and the substrate;
a transistor including a gate electrode over the first semiconductor layer and the cavity;
a buried insulator layer including a plurality of sections positioned on the substrate between the first semiconductor layer and the substrate, the plurality of sections of the buried insulator layer arranged to surround the cavity;
an interconnect structure over the layer stack and the transistor, the interconnect structure including a plurality of metallization levels and a back gate contact that extends through the buried insulator layer to be coupled with a portion of the substrate that is beneath the buried insulator layer and that extends beneath the transistor; and
a first opening and a second opening extending through the metallization levels of the interconnect structure and the first semiconductor layer to the cavity, the first opening defining a fluid inlet coupled to the cavity, and the second opening defining a fluid outlet coupled to the cavity.

2. The structure of claim 1 wherein the transistor is laterally positioned between the first opening and the second opening.

3. The structure of claim 1 further comprising:
an anchor extending through the first semiconductor layer and the cavity, the anchor positioned to surround the cavity.

4. The structure of claim 3 wherein the anchor is comprised of a dielectric material, and the anchor is located in a trench extending through the first semiconductor layer adjacent to the cavity.

5. The structure of claim 4 wherein the trench penetrates into the substrate, and the anchor extends within the trench into the substrate.

6. The structure of claim 3 wherein the interconnect structure includes a contact level having an interlayer dielectric layer positioned directly over the transistor and the layer stack, and the anchor is positioned in part in the interlayer dielectric layer of the contact level.

7. The structure of claim 6 wherein the first opening and the second opening each extend through the interlayer dielectric layer of the contact level.

8. The structure of claim 3 further comprising:
a trench isolation region positioned to surround the first semiconductor layer and the cavity,
wherein the anchor is positioned laterally between the trench isolation region and the first semiconductor layer, and the anchor is positioned laterally between the trench isolation region and the cavity.

9. The structure of claim 1 further comprising:
a liner having a first section positioned between the first opening and the first semiconductor layer and a second section positioned between the second opening and the first semiconductor layer.

10. The structure of claim 9 wherein the first section and the second section of the liner terminate at the cavity.

11. The structure of claim 1 wherein the transistor, the layer stack, and the interconnect structure are located on a chip, and further comprising:
a front-end block monolithically located on the chip.

12. The structure of claim 1 wherein the buried insulator layer is a buried oxide layer.

13. A structure for a sensor, the structure comprising:
a layer stack including a cavity, a first semiconductor layer, a second semiconductor layer, and a third semiconductor layer, the cavity located between the second semiconductor layer and the third semiconductor layer, the first semiconductor layer comprised of a first single-crystal III-V material, and the second semiconductor layer and the third semiconductor layer comprised of a second single-crystal III-V material with a different composition than the first single-crystal III-V material;
a transistor including a gate electrode over the layer stack;
an interconnect structure over the layer stack and the transistor, the interconnect structure including a plurality of metallization levels; and
a first opening and a second opening extending through the metallization levels of the interconnect structure and the first semiconductor layer to the cavity, the first opening defining a fluid inlet coupled to the cavity, and the second opening defining a fluid outlet coupled to the cavity.

14. The structure of claim 13 further comprising:
a back gate contact coupled to a portion of the first semiconductor layer.

15. The structure of claim 13 wherein the transistor is laterally positioned between the first opening and the second opening.

16. The structure of claim 13 further comprising:
a liner having a first section positioned between the first opening and the first semiconductor layer and a second section positioned between the second opening and the first semiconductor layer,
wherein the first section and the second section of the liner terminate at the cavity.

17. The structure of claim 13 wherein the layer stack includes a fourth semiconductor layer comprised of a third single-crystal III-V material, and the fourth semiconductor layer is located below the gate electrode.

18. The structure of claim 13 wherein the transistor, the layer stack, and the interconnect structure are located on a chip, and further comprising:
a front-end block monolithically located on the chip.

19. The structure of claim 13 wherein the second single-crystal III-V material is a ternary III-V semiconductor material or a quaternary III-V semiconductor material.

20. The structure of claim 19 wherein the first single-crystal III-V material is a binary III-V semiconductor material.

* * * * *